US011251315B2

(12) United States Patent
Smith et al.

(10) Patent No.: US 11,251,315 B2
(45) Date of Patent: Feb. 15, 2022

(54) SOLAR CELLS WITH IMPROVED LIFETIME, PASSIVATION AND/OR EFFICIENCY

(71) Applicant: SunPower Corporation, San Jose, CA (US)

(72) Inventors: David D. Smith, Campbell, CA (US); Tim Dennis, Canton, TX (US); Russelle De Jesus Tabajonda, Banlic Cabuyao (PH)

(73) Assignee: SunPower Corporation, San Jose, CA (US)

( * ) Notice: Subject to any disclaimer, the term of this patent is extended or adjusted under 35 U.S.C. 154(b) by 13 days.

(21) Appl. No.: 16/877,255

(22) Filed: May 18, 2020

(65) Prior Publication Data
US 2021/0043782 A1 Feb. 11, 2021

Related U.S. Application Data

(60) Continuation of application No. 16/228,165, filed on Dec. 20, 2018, now Pat. No. 10,658,525, which is a
(Continued)

(51) Int. Cl.
*H01L 31/028* (2006.01)
*H01L 31/02* (2006.01)
(Continued)

(52) U.S. Cl.
CPC .... *H01L 31/02008* (2013.01); *H01L 21/3221* (2013.01); *H01L 31/02167* (2013.01);
(Continued)

(58) Field of Classification Search
CPC ........... H01L 31/02008; H01L 31/1804; H01L 31/1872; H01L 31/1864; H01L 31/3068; H01L 31/022441
(Continued)

(56) References Cited

U.S. PATENT DOCUMENTS 7,718,888 B2 5/2010 Cousins
7,737,357 B2 6/2010 Cousins
(Continued)

FOREIGN PATENT DOCUMENTS

CN 102694077 9/2012
JP 2011-166021 A 8/2011

OTHER PUBLICATIONS

Pre-Interview Office Action for U.S. Appl. No. 14/579,935 dated Jan. 11, 2016, 4 pgs.
(Continued)

*Primary Examiner* — Long K Tran
(74) *Attorney, Agent, or Firm* — Schwabe, Williamson & Wyatt, P.C.

(57) ABSTRACT

A method of fabricating a solar cell can include forming a dielectric region on a silicon substrate. The method can also include forming an emitter region over the dielectric region and forming a dopant region on a surface of the silicon substrate. In an embodiment, the method can include heating the silicon substrate at a temperature above 900 degrees Celsius to getter impurities to the emitter region and drive dopants from the dopant region to a portion of the silicon substrate.

20 Claims, 7 Drawing Sheets

Related U.S. Application Data division of application No. 15/876,927, filed on Jan. 22, 2018, now Pat. No. 10,170,642, which is a continuation of application No. 15/213,273, filed on Jul. 18, 2016, now Pat. No. 9,899,542, which is a continuation of application No. 14/579,935, filed on Dec. 22, 2014, now Pat. No. 9,520,507.

(51) Int. Cl.
| | |
|---|---|
| *H01L 31/18* | (2006.01) |
| *H01L 31/0224* | (2006.01) |
| *H01L 31/0216* | (2014.01) |
| *H01L 31/0745* | (2012.01) |
| *H01L 31/0747* | (2012.01) |
| *H01L 21/322* | (2006.01) |
| *H01L 31/068* | (2012.01) |
| *H01L 31/0368* | (2006.01) |

(52) U.S. Cl.
CPC .. *H01L 31/022441* (2013.01); *H01L 31/0368* (2013.01); *H01L 31/03682* (2013.01); *H01L 31/068* (2013.01); *H01L 31/0745* (2013.01); *H01L 31/0747* (2013.01); *H01L 31/1804* (2013.01); *H01L 31/186* (2013.01); *H01L 31/1864* (2013.01); *H01L 31/1872* (2013.01); *Y02E 10/547* (2013.01); *Y02P 70/50* (2015.11)

(58) Field of Classification Search
USPC .......................................................... 257/79
See application file for complete search history.

(56) References Cited

U.S. PATENT DOCUMENTS

| | | | |
|---|---|---|---|
| 8,815,631 B2 | 8/2014 | Cousins | |
| 9,269,839 B2 | 2/2016 | Lee et al. | |
| 9,362,426 B2 | 6/2016 | Goto et al. | |
| 9,520,507 B2 | 12/2016 | Smith et al. | |
| 2008/0197454 A1 | 8/2008 | Rakotoniana et al. | |
| 2008/0217747 A1 | 9/2008 | Chudzik et al. | |
| 2010/0084009 A1 | 4/2010 | Carlson et al. | |
| 2010/0105190 A1 | 4/2010 | Ferre | |
| 2010/0139763 A1* | 6/2010 | Van Nieuwenhuysen | H01L 31/1804 136/256 |
| 2010/0304527 A1 | 12/2010 | Borden et al. | |
| 2012/0305060 A1 | 12/2012 | Fu et al. | |
| 2013/0247965 A1 | 9/2013 | Swanson et al. | |
| 2013/0247981 A1* | 9/2013 | Yelundur | H01L 31/02167 136/259 |
| 2014/0061531 A1 | 3/2014 | Faur et al. | |
| 2014/0166086 A1 | 6/2014 | Marshall | |
| 2014/0166089 A1 | 6/2014 | Shepherd et al. | |
| 2014/0166095 A1 | 6/2014 | Loscutoff et al. | |
| 2014/0360571 A1 | 12/2014 | Ji et al. | |
| 2015/0162483 A1 | 6/2015 | Weidman et al. | |
| 2016/0056322 A1 | 2/2016 | Yang et al. | |
| 2016/0126368 A1 | 5/2016 | Lee et al. | |
| 2016/0155866 A1 | 6/2016 | Ha et al. | |
| 2016/0155877 A1 | 6/2016 | Chung et al. | |
| 2016/0155885 A1 | 6/2016 | Shim et al. | |
| 2016/0181461 A1 | 6/2016 | Ueyama et al. | |
| 2016/0197210 A1 | 7/2016 | Hayashi et al. | |
| 2016/0240704 A1 | 8/2016 | Shim | |
| 2016/0240705 A1 | 8/2016 | Takahama | |
| 2016/0268454 A1 | 9/2016 | Gwon | |

OTHER PUBLICATIONS

International Search Report and Written Opinion from PCT/US2015/067220 dated Apr. 29, 2016, 13 pgs.
First Action Interview Pre-Interview Communication from U.S. Appl. No. 15/213,273 dated Mar. 7, 2017, 7 pgs.
First Action Interview Office Action Summary from U.S. Appl. No. 15/213,273 dated May 23, 2017, 6 pgs.
International Preliminary Report on Patentability from PCT/US2015/067220 dated Jul. 6, 2017, 11 pgs.
Extended European Search Report from European Patent Application No. 15874267.6 dated Mar. 9, 2018, 15 pgs.
Jan Bultman, et al. "Methods of emitter formation for crystalline silicon solar cells," May 31, 2010 (May 31, 2010), XP055026905, Retrieved from the Internet, www.pv-tech.org, Apr. 10, 2018, 12 pgs.
First Office Action for Chinese Application No. 2015800700209, dated Aug. 31, 2018; 14 pgs.
First Action Interview Pre-Interview Communication from U.S. Appl. No. 16/228,165 dated Apr. 8, 2019, 6 pgs.
Second Office Action from Chinese Patent Application No. 2015800700209 dated Apr. 19, 2019, 12 pgs.
Examination Report from European Patent Application No. 15874267.6 dated Apr. 30, 2019, 6 pgs.
First Action Interview from U.S. Appl. No. 16/228,165 dated Jul. 12, 2019, 5 pgs.
Rejection Decision from Chinese Patent Application No. 2015800700209 dated Oct. 28, 2019, 9 pgs.
Reexamination Notice from Chinese Patent Application No. 2015800700209 dated Jul. 3, 2020, 12 pgs.
Official Communication from European Patent Application No. 158/4267.6 dated Dec. 8, 2020, 15 pgs.

* cited by examiner

| Example Process | Temp | Surface Dopant Conc. | Gettering Location | Surface Passivation | Lifetime | Efficiency |
|---|---|---|---|---|---|---|
| A | ≤ 900 deg-C | $2 \times 10^{18}$ cm$^{-3}$ | non-poly | 2fA/cm$^2$ | ~3msec | Baseline |
| B | ≤ 900 deg-C | $4 \times 10^{18}$ cm$^{-3}$ | non-poly | 5fA/cm$^2$ | ~10msec | Baseline |
| C | ≤ 900 deg-C | $2 \times 10^{18}$ cm$^{-3}$ | poly | 2fA/cm$^2$ | ~10msec | +0.5 % abs. |
| D | ≤ 900 deg-C | $4 \times 10^{18}$ cm$^{-3}$ | poly | 5fA/cm$^2$ | ~10msec | Baseline |

Table 1. Example Processes for Solar Cell Fabrication

FIG. 11

SOLAR CELLS WITH IMPROVED LIFETIME, PASSIVATION AND/OR EFFICIENCY

CROSS-REFERENCE TO RELATED APPLICATIONS

This application is a continuation of U.S. patent application Ser. No. 16/228,165, filed on Dec. 20, 2018, which is a divisional of U.S. patent application Ser. No. 15/876,927, filed on Jan. 22, 2018, now U.S. Pat. No. 10,170,642, issued on Jan. 1, 2019, which is a continuation of U.S. patent application Ser. No. 15/213,273, filed on Jul. 18, 2016, now U.S. Pat. No. 9,899,542, issued on Feb. 20, 2018, which is a continuation of U.S. patent application Ser. No. 14/579,935, filed on Dec. 22, 2014, now U.S. Pat. No. 9,520,507, issued on Dec. 13, 2016, the entire contents of which are hereby incorporated by reference herein.

BACKGROUND

Photovoltaic (PV) cells, commonly known as solar cells, are devices for conversion of solar radiation into electrical energy. Generally, solar radiation impinging on the surface of, and entering into, the substrate of a solar cell creates electron and hole pairs in the bulk of the substrate. The electron and hole pairs migrate to p-doped and n-doped regions in the substrate, thereby creating a voltage differential between the doped regions. The doped regions are connected to the conductive regions on the solar cell to direct an electrical current from the cell to an external circuit. When PV cells are combined in an array such as a PV module, the electrical energy collect from all of the PV cells can be combined in series and parallel arrangements to provide power with a certain voltage and current.

Efficiency is an important characteristic of a solar cell as it is directly related to the solar cell's capability to generate power. Accordingly, techniques for improving the fabrication process, reducing the cost of manufacturing and increasing the efficiency of solar cells are generally desirable.

BRIEF DESCRIPTION OF THE DRAWINGS

FIG. 11 illustrates example processes for solar cell fabrication.

DETAILED DESCRIPTION

Figure 1:
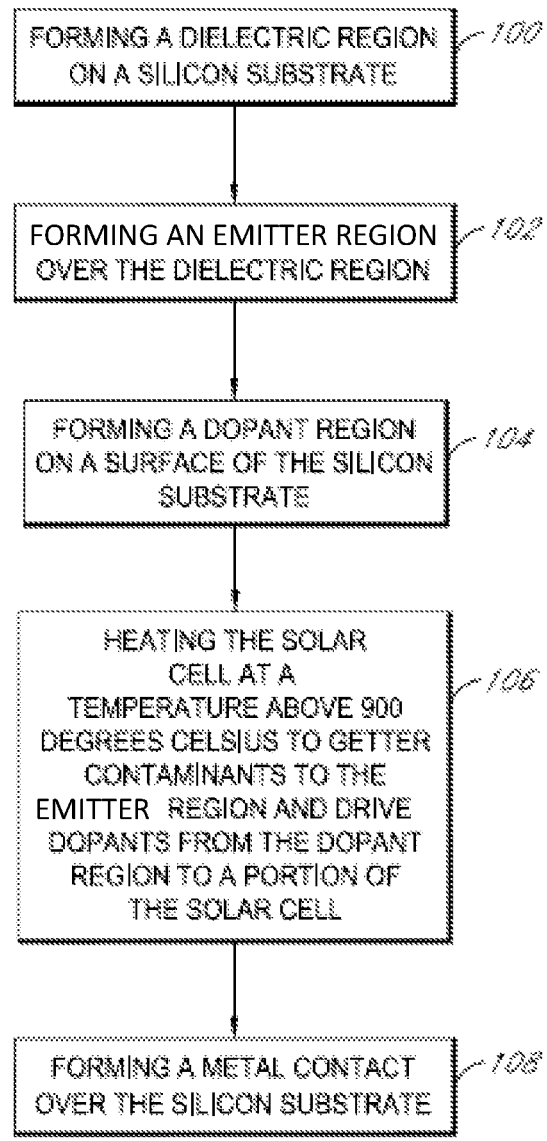
FIG. 1 illustrates a flow chart representation of an example method for fabricating of a solar cell, according to some embodiments.

The following detailed description is merely illustrative in nature and is not intended to limit the embodiments of the subject matter of the application or uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

Terminology. The following paragraphs provide definitions and/or context for terms found in this disclosure (including the appended claims):

"Comprising." This term is open-ended. As used in the appended claims, this term does not foreclose additional structure or steps.

"Configured To." Various units or components may be described or claimed as "configured to" perform a task or tasks. In such contexts, "configured to" is used to connote structure by indicating that the units/components include structure that performs those task or tasks during operation. As such, the unit/component can be said to be configured to perform the task even when the specified unit/component is not currently operational (e.g., is not on/active). Reciting that a unit/circuit/component is "configured to" perform one or more tasks is expressly intended not to invoke 35 U.S.C. § 112, sixth paragraph, for that unit/component.

"First," "Second," etc. As used herein, these terms are used as labels for nouns that they precede, and do not imply any type of ordering (e.g., spatial, temporal, logical, etc.). For example, reference to a "first" emitter region does not necessarily imply that this emitter region is the first emitter region in a sequence; instead the term "first" is used to differentiate this emitter region from another emitter region (e.g., a "second" emitter region). In an embodiment, an emitter region can be a doped region of a solar cell for collecting positive and negative charge carriers. In an example, the emitter region can be a doped polysilicon region. In one example, the emitter region can be a P-type doped polysilicon region or an N-type doped polysilicon region.

"Based On." As used herein, this term is used to describe one or more factors that affect a determination. This term does not foreclose additional factors that may affect a determination. That is, a determination may be solely based on those factors or based, at least in part, on those factors. Consider the phrase "determine A based on B." While B may be a factor that affects the determination of A, such a phrase does not foreclose the determination of A from also being based on C. In other instances, A may be determined based solely on B.

"Coupled"—The following description refers to elements or nodes or features being "coupled" together. As used herein, unless expressly stated otherwise, "coupled" means that one element/node/feature is directly or indirectly joined to (or directly or indirectly communicates with) another element/node/feature, and not necessarily mechanically.

In addition, certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", "side", "outboard", and "inboard" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

In the following description, numerous specific details are set forth, such as specific operations, in order to provide a thorough understanding of embodiments of the present disclosure. It will be apparent to one skilled in the art that embodiments of the present disclosure may be practiced without these specific details. In other instances, well-known techniques are not described in detail in order to not unnecessarily obscure embodiments of the present disclosure.

This specification first describes solar cell fabrication techniques to improve solar cell lifetime, passivation and/or efficiency followed by a description of example solar cells fabricated according to the disclosed techniques. Various embodiments are provided throughout followed by example results from the disclosed techniques.

Turning now to FIG. 1, a method for fabricating a solar cell is shown, according to some embodiments. In various embodiments, the method of FIG. 1 can include additional (or fewer) blocks than illustrated. For example, in some embodiments, the silicon region formed at block 102 can be heated to form a polysilicon region after step 102 but before to the heating step of block 106.

At 100, a dielectric can be formed on a silicon substrate of a solar cell. In some embodiments, the silicon substrate can be cleaned, polished, planarized, and/or thinned or otherwise processed prior to the formation of the dielectric region. In an embodiment, the silicon substrate can be single-crystalline or a multicrystalline silicon substrate. In an embodiment, the silicon substrate can be a N-type silicon substrate. In an embodiment, the dielectric can be a tunnel oxide. In one embodiment, the dielectric can be silicon dioxide. In an embodiment, the dielectric region can be grown and/or formed through a thermal process.

At 102, an emitter region can be formed over the dielectric region. In an embodiment, the emitter region can be an amorphous silicon region. In some embodiments, the amorphous silicon region can be grown over the dielectric region. In an embodiment, the emitter region can be polysilicon. In an embodiment, the emitter region can be grown and/or formed through a thermal process. In an example, an amorphous silicon region can be formed over the dielectric region and heated to form a polysilicon region.

An emitter dopant region can be deposited over the emitter region through a deposition process. The emitter dopant region can comprise a dopant, such as a positive-type doping material such as boron or a negative-type doping material such as phosphorous.

Although the dielectric region and/or the emitter region are described as being grown by a thermal process or deposited through conventional deposition process, respectively, as with any other formation, deposition, or growth process step described or recited here, each layer or substance can be formed using any appropriate process. For example, a chemical vapor deposition (CVD) process, low-pressure CVD (LPCVD), atmospheric pressure CVD (APCVD), plasma-enhanced CVD (PECVD), thermal growth, sputtering, as well as any other desired technique can be used where formation is described. Thus, and similarly, the emitter dopant region can be formed on the substrate by a deposition technique, implant process, sputter, or print process, such as inkjet printing or screen printing.

In an embodiment, a heating process can be performed to drive dopants from the emitter dopant region to the emitter region. In one example, the heating process can drive dopants from the emitter dopant region to a polysilicon region to form a doped polysilicon region. In an embodiment, the doped polysilicon region can be doped with a P-type dopant such as boron or an N-type dopant such as phosphorus. In one example, the doped polysilicon regions can be formed in alternating P-type and N-type regions. In some embodiments, the heating to drive dopants from the emitter dopant region to the emitter region, can be performed at a temperature below 900 degrees Celsius.

At 104, a dopant region can be formed over a surface of the silicon substrate. In an embodiment, the dopant region can be grown and/or formed through a thermal process. In one example, the dopant region can be formed over a surface, e.g., on the front side of a solar cell, and subsequently a heating process can be performed to drive dopants into a portion of the silicon substrate. In an embodiment, the portion of the silicon substrate can have a dopant concentration of approximately less than or equal to $2\times10^{18}$ cm$^{-3}$ after the heating process as discussed in block 106.

Figure 2:
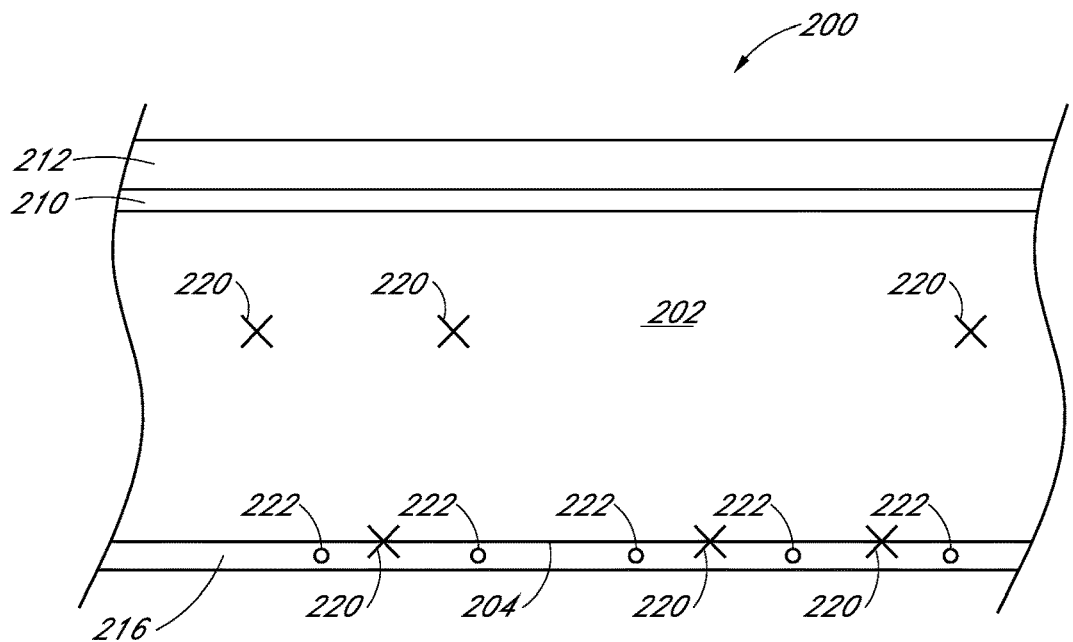
FIGS. 2-4 illustrate cross-sectional views of example solar cells during the fabrication process of FIG. 1, according to some embodiments.

In one embodiment, the dopant region can be an N-type dopant, e.g., phosphorus. In an embodiment, the surface of the silicon substrate over which the dopant region is formed can be a front side, back side, or both on the front and back sides of the solar cell. FIG. 2 shows an example solar cell having the dielectric region, emitter region and dopant region described above.

Although the dopant region is described as being grown by a thermal process or deposited through conventional deposition process, respectively, as with any other formation, deposition, or growth process step described or recited here, each layer or substance can be formed using any appropriate process. For example, a chemical vapor deposition (CVD) process, low-pressure CVD (LPCVD), atmospheric pressure CVD (APCVD), plasma-enhanced CVD (PECVD), thermal growth, sputtering, as well as any other desired technique can be used where formation is described.

FIG. 2 illustrates an example solar cell after forming the dielectric region, emitter region, and dopant region, according to some embodiments. In an embodiment, a dielectric region 210 can be formed over a silicon substrate 202 of the solar cell 200. In an embodiment, the dielectric region 210 can be a tunnel oxide. In one example, the dielectric region 210 can be silicon dioxide. In an embodiment, an emitter region 212 can be formed on the dielectric region 210. In an embodiment and as noted above, the emitter region 212 can be amorphous silicon or polysilicon. In an embodiment, the emitter region 212 can be a doped polysilicon. In an example, the doped polysilicon can be N-type doped or P-type doped polysilicon.

In an embodiment, a dopant region 216 can be formed on a surface 204 of silicon substrate 202. In an embodiment, the dopant region 216 can be formed to dope the surface 204 (e.g., at block 106 below) to repel charge carriers and prevent and/or reduce recombination at the surface 204 of the solar cell 200. In an example, the surface 204, can be on a front side and/or a back side of the solar cell. In one example, the dopant region 216 can be a N-type dopant region, such as phosphorus. In an embodiment, the dopant region 216 can have positive or negative type dopants 222.

In an embodiment, the silicon substrate 202 can have contaminants and/or impurities 220, for example metal contaminants and/or metal impurities, such as iron, nickel and/or chromium among others. Metal impurities can be detrimental to the electrical conduction of the solar cell as these impurities can be sources of recombination, resulting in poor lifetime, surface passivation and/or lower solar cell efficiency. In an embodiment, the impurities 220 can be located at or near a surface 204 of the silicon substrate 202. In an embodiment, the impurities 220 can be located within the silicon substrate 202 as shown. As referred throughout, contaminants and/or impurities can be used interchangeably.

The emitter regions 212, e.g., polysilicon regions, can be a good sink and/or trap for the metal impurities 220 discussed above. A gettering process can be used to trap the metal impurities 220 in the emitter regions 212, reducing recombination within the silicon substrate 202 and improving overall solar cell lifetime. Oxides and/or tunnel oxides, such as the dielectric region 210 of FIG. 2, can be barriers to gettering of the metal impurities 220 to emitter regions 212. In one example, heating at temperature at 900 degrees Celsius or below can be insufficient to diffuse metal impurities through a tunnel oxide and into a polysilicon region. Thus, in an embodiment, heating at temperatures above 900 degrees Celsius can include gettering metal impurities 220 through the dielectric region 210, e.g., tunnel oxide, to into the emitter region 212, e.g., polysilicon regions, as discussed in detail at 106 of FIG. 1 below.

Figure 3:
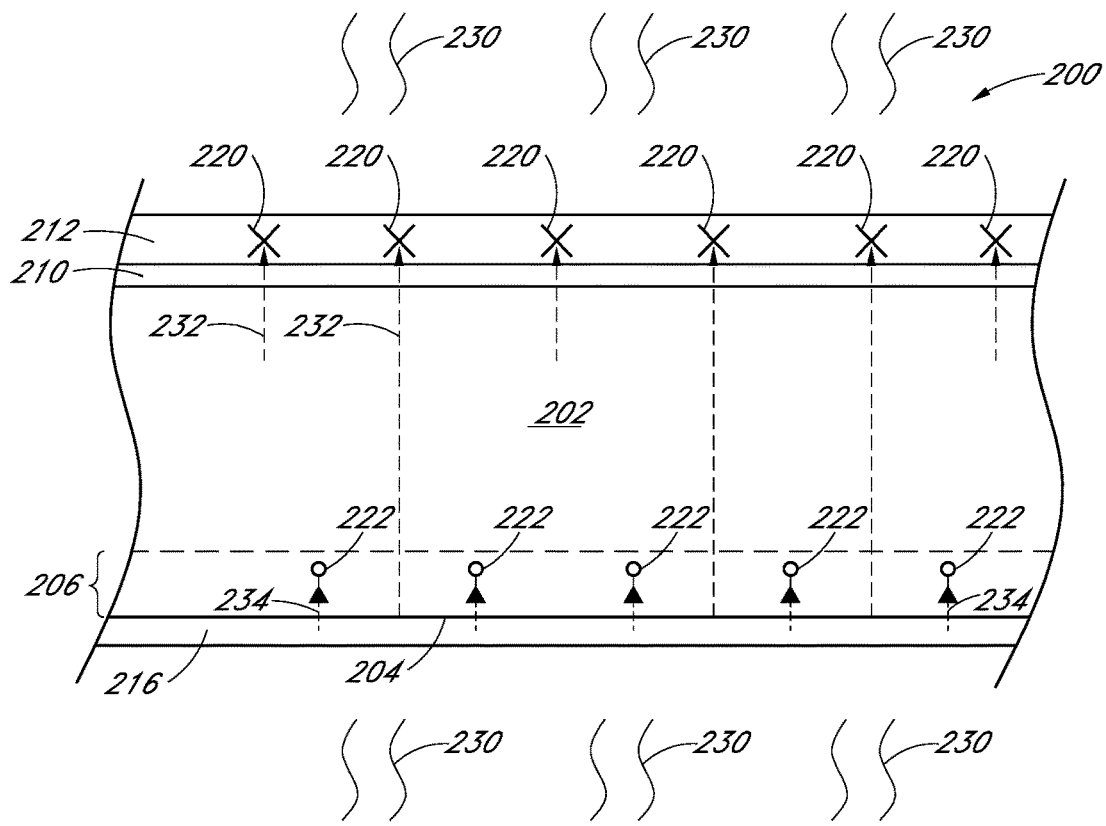

At 106, the solar cell can be heated at a temperature above 900 degrees Celsius. In an embodiment, the heating can drive dopants from the dopant region to a portion of the silicon substrate. In one embodiment, the heating can include performing an annealing process on the silicon substrate. In an example, the heating can drive dopants to the portion of the silicon substrate located above the surface, as shown in FIG. 3. In some embodiments, the surface can be on the front side, back side or both on the front and back side of the solar cell. In an embodiment, the heating can include gettering contaminants, e.g. metal impurities and/or metal contaminants, from the substrate to the emitter region. In an example, the metal impurities and/or metal contaminants can be iron, nickel and/or chromium among others.

In one example, the heating can include placing the solar cell in thermal tool, e.g., a thermal furnace or oven among others, and raising the temperature in the thermal tool to 975 degrees Celsius or above.

In an embodiment, the heating can be the last heating step in the solar cell fabrication process. In one embodiment, the heating can be the only heating step in the fabrication process. In some embodiments, at least one other heating step can be performed before the heating process of block 106. In one example, the other heating process, aside from the heating process of block 106, can include heating the solar cell to temperature below 900 degrees Celsius. In an example, the heating process below 900 degrees Celsius can be performed before the heating process at 106. In an embodiment, the heating performed at 106 can be performed at the highest temperature among other heating steps performed in the solar cell fabrication process. FIG. 3 illustrates the heating process described above.

FIG. 3 illustrates heating the solar cell of FIG. 2, according to some embodiments. In an embodiment, the heating 230 can include heating the solar cell 200 above 900 degrees Celsius. In an example, the heating can include placing the solar cell 200 into a thermal tool, e.g., thermal furnace or oven among others, and raising the temperature within the thermal tool to 975 degrees Celsius or higher. In an embodiment, the heating 230 can drive 234 the dopants 222 from the dopant region 216 to a portion 206 of the silicon substrate 202. In an example, the dopant concentration of the portion 206 of the silicon substrate 202 can be approximately less than or equal to $2 \times 10^{18}$ cm$^{-3}$ after the heating. In an embodiment, the portion 206 of the silicon substrate 202 can be above, as shown, the surface 204 of the silicon substrate 202. In an embodiment, the heating 230 can getter 232 contaminants 220 from, or nearby, the surface 204 of the silicon substrate 202 and/or from within the silicon substrate 202 to the emitter region 212. In an embodiment, the heating 230 can getter 232 the containments 220 through the dielectric region 210 to the emitter region 212.

Figure 4:
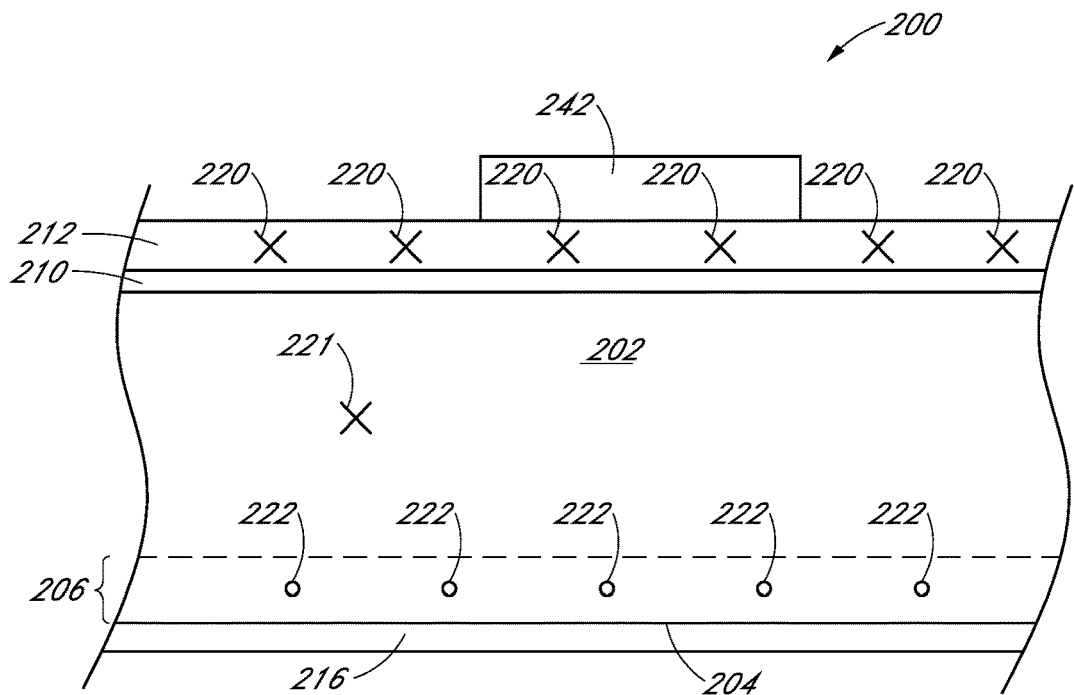

At 108, a metal contact can be formed over the silicon substrate. In an embodiment, the metal contact can be formed on the emitter region. In some embodiments, the metal contact can be formed by a metallization process. In one example, the metallization process can include plating and/or electroplating the metal contact to the emitter region. In some embodiments, the metal contact can be formed by printing and/or foil-based metallization techniques. FIG. 4 illustrates an example silicon substrate after to forming the metal contact. Also FIG. 4 illustrates a single metal contact, for example, which can be on a front side or back side of the solar cell. In an embodiment, multiple metal contacts can exist. In an example, positive and negative metal contacts can be formed in an interdigitated pattern.

With reference to FIG. 4, the solar cell of FIG. 3 is shown after forming a metal contact, according to some embodiments. In an embodiment, the metal contact 242 can be formed on the emitter region 212, e.g. over the silicon substrate 202. In an example, the metal contact 242 can be formed by an electroplating process, printing process or a foil-based metallization process among others. In an embodiment, the metal contact 242 can be a positive or negative metal contact. As shown in FIG. 4 a single metal contact is illustrated for example, which can be on a front side or back side of the solar cell. In an example, multiple metal contacts, e.g. some positive and others negative, can exist. In one embodiment, the silicon substrate 202 can have some impurities 221 remaining after the heating 230 of FIG. 3.

Figure 5:
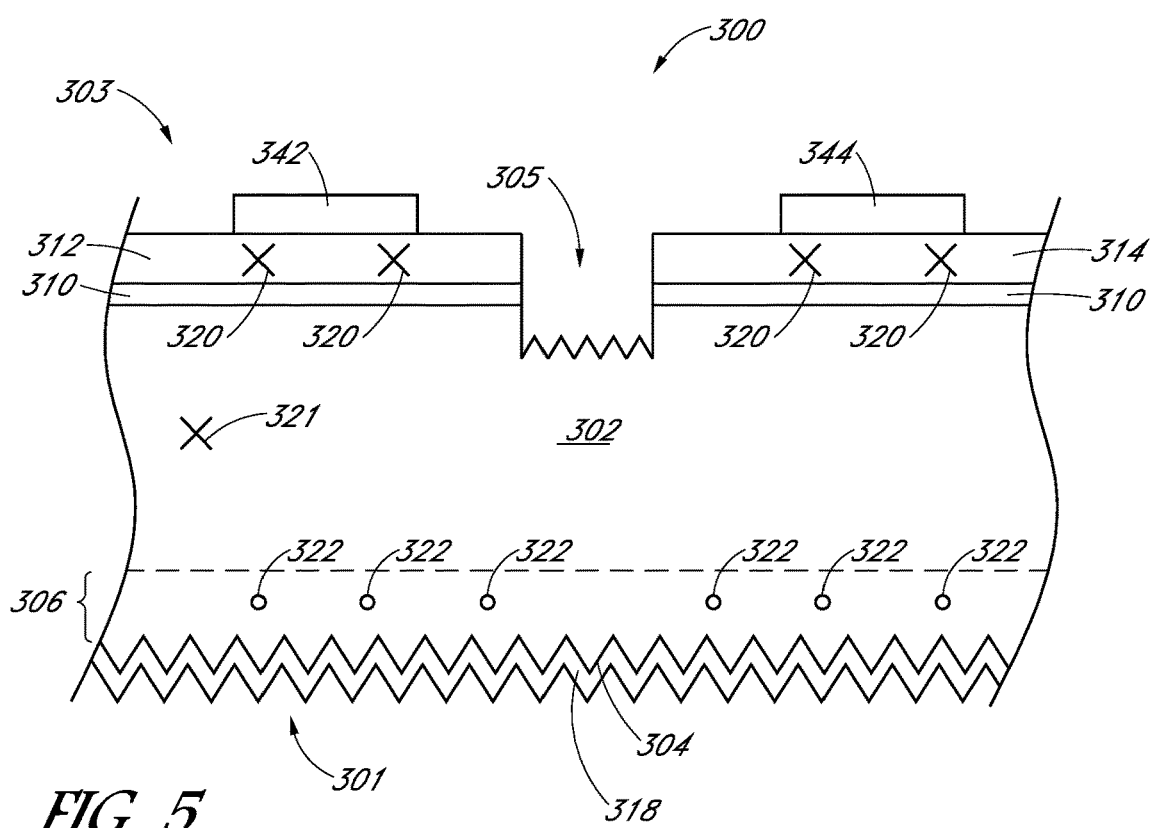
FIG. 5 illustrates a cross-sectional view of an example solar cell, according to some embodiments.

FIG. 5 illustrates a cross-section of a portion of a solar cell formed from the method of FIGS. 1-4, according to some embodiments. The solar cell 300 can have a front side 301 which faces the sun during normal operation and a back side 303 opposite the front side 301. The solar cell 300 can include a silicon substrate 302. In an embodiment, the silicon substrate 302 can be an N-type silicon substrate. In an embodiment, a portion 306 of the silicon substrate 302 can have a doping concentration 322 of approximately less than or equal to $2 \times 10^{18}$ cm$^{-3}$.

The solar cell 300 can have a dielectric region 310 formed over the silicon substrate 302. In an embodiment, the dielectric 310 can be a tunnel oxide. In some embodiments, the dielectric region 310 can be silicon dioxide. In an embodiment, the solar cell 300 can have first and second emitter regions 312, 314. In an example, the first and second emitter regions 312, 314 can be P-type and N-type doped polysilicon regions, respectively. In an example, impurities and/or contaminants 320, e.g. metal impurities 320 and/or metal contaminants, can be located in the first and second emitter regions 312, 314 as shown. In one embodiment, the silicon substrate 302 can have some impurities 321 remaining after the gettering process.

In an embodiment, the solar cell 300 can have first and second metal contacts 342, 344 formed on the first and second emitter regions 312, 314, respectively. In some embodiments, a trench region 305 can be formed, which can separate the first and second emitter regions 312, 314. In an embodiment, the solar cell 300 can have a textured surface 304 on the front side 301. In an example, the textured surface 304 can be a surface which can provide additional light absorption. In an embodiment, the portion 306 of the silicon substrate 302 can be formed above a textured surface 304 as shown. In some embodiments, the trench region 305 can also be textured, similar to the textured surface 304, for additional light absorption from the back side 303 of the solar cell 300. In some embodiments, an anti-reflective region (ARC) 318 can be formed over the textured surface 304 of the solar cell 300. In some embodiments, the anti-reflective region 318 can be silicon nitride.

Figure 7:
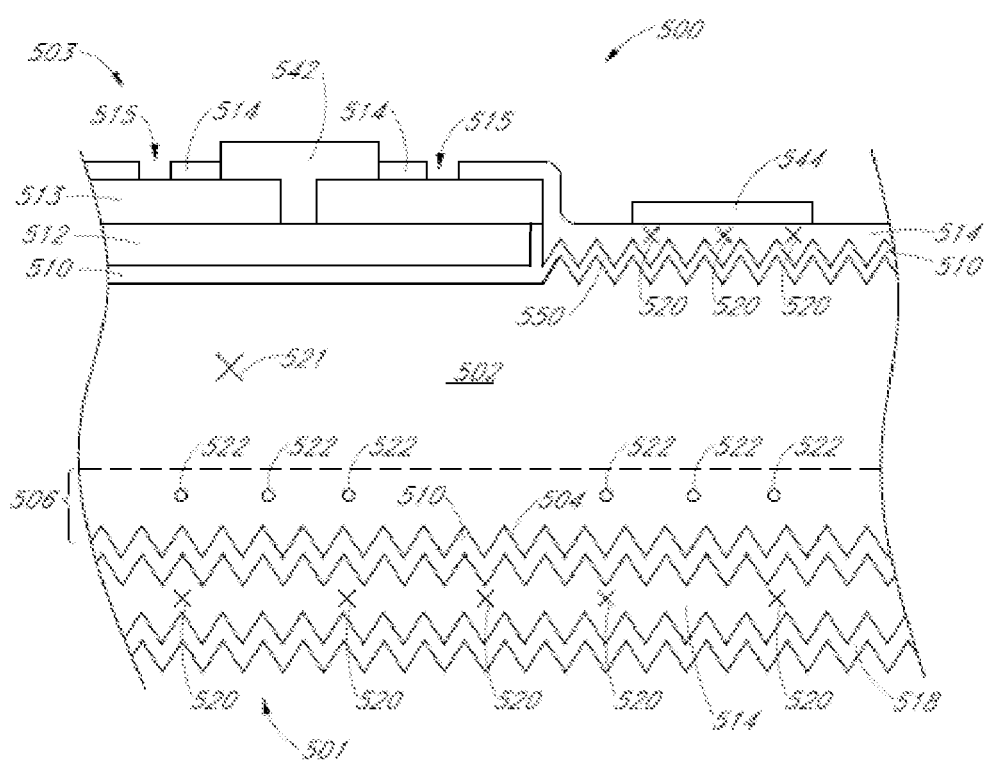
FIG. 7 illustrates a cross-sectional view of still another example solar cell, according to some embodiments.

In an embodiment, the solar cell 300 can be a back contact solar cell, for example, as shown in FIGS. 5 and 7.

Figure 6:
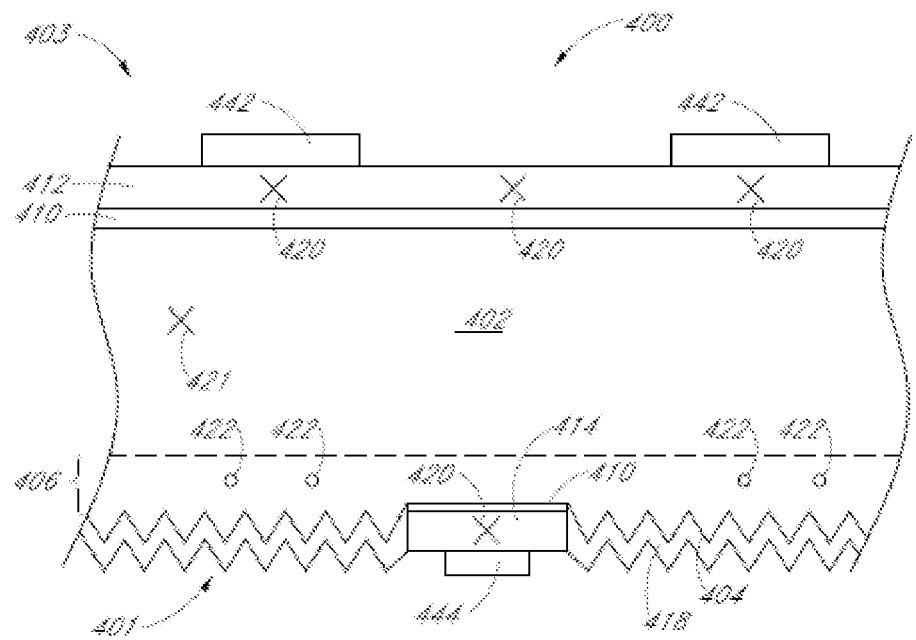
FIG. 6 illustrates a cross-sectional view of another example solar cell, according to some embodiments.

With reference to FIG. 6, a front contact solar cell formed from the method of FIGS. 1-4 is shown, according to some embodiments. The solar cell 400 can have a front side 401 which faces the sun during normal operation and a back side 403 opposite the front side 401. The solar cell 400 can include a silicon substrate 402. In an embodiment, the silicon substrate 402 can be a N-type silicon substrate. In an embodiment, a portion 406 of the silicon substrate 402 can have a doping concentration 422 of approximately less than or equal to $2 \times 10^{18}$ cm$^{-3}$.

The solar cell 400 can have a dielectric 410 formed over the silicon substrate 402. In an embodiment, the dielectric 410 can be a tunnel oxide. In some embodiments, the dielectric 410 can be silicon dioxide. In an embodiment, the solar cell 400 can have first and second emitter regions 412, 414. In some embodiments, the first emitter region 412 can be formed on the back side 403 of the solar cell 400 and the second emitter region 414 can be formed on the front side 401 of the solar cell 400. In an example, the first and second emitter regions 412, 414 can be P-type and/or N-type doped polysilicon regions.

In an embodiment, the solar cell 400 can have first and second metal contacts 442, 444 formed on the first and second emitter regions 412, 414, respectively. In an embodiment, the solar cell 400 can have a textured surface 404 on the front side 401. In an example, the textured surface 404 can be a surface which can provide additional light absorption. In an embodiment, the portion 406 of the silicon substrate 402 can be above a textured surface 404 as shown. In some embodiments, an anti-reflective region (ARC) 418 can be formed over the textured surface 404 of the solar cell 400. In some embodiments, the anti-reflective region 418 can be silicon nitride.

In an example, impurities and/or contaminants 420, e.g. metal impurities and/or contaminants, can be located in the first and second emitter regions 412, 414. In one embodiment, the silicon substrate 402 can have some impurities 421 remaining after the gettering process.

FIG. 7 illustrates still another solar cell formed from the method of FIGS. 1-4, according to some embodiments. The solar cell 500 can have a front side 501 which faces the sun during normal operation and a back side 503 opposite the front side 501. The solar cell 500 can include a silicon substrate 502. In an embodiment, the silicon substrate 502 can be a N-type silicon substrate. In an embodiment, a portion 506 of the silicon substrate 502 can have a doping concentration 522 of approximately equal to or less than $2 \times 10^{18}$ cm$^{-3}$.

The solar cell 500 can have a dielectric region 510 formed over the silicon substrate 502. In an embodiment, the dielectric 510 can be a tunnel oxide. In an embodiment, the dielectric region 510 can be silicon dioxide. In an embodiment, the solar cell 500 can have first and second emitter regions 512, 514. In an example, the first and second emitter regions 512, 514 can be P-type and/or N-type doped polysilicon regions, respectively. In one embodiment, the second emitter region 514 can be at least partially formed over the first emitter region 512, as shown. In an embodiment, a second dielectric region 513 can be formed over the first emitter region 512, e.g. to insulate the first emitter region 512 from the second emitter region 514. In some embodiments, the second dielectric region 513 can also be silicon dioxide. In an embodiment, an opening 515 can isolate the second emitter region 514 from the first metal contact 542.

In some embodiments, the dielectric region 510 and second silicon region 514 can be formed over the back side 501 of the solar cell 500.

In an example, impurities and/or contaminants 520, e.g. metal impurities and/or contaminants, can be located in the second emitter region 512 as shown. In an example, the metal impurities 520 can be iron, nickel and/or chromium among others. In one embodiment, the silicon substrate 502 can have some impurities 521 remaining after the heating process.

In an embodiment, the solar cell 500 can have first and second metal contacts 542, 544 formed on the first and second emitter regions 512, 514, respectively. In one embodiment, the solar cell 500 can have a textured surface 504 on the front side 501 and/or a textured surface 550 on the back side 503 as shown. In an example, the textured surfaces 504, 550 can be surfaces which can provide additional light absorption. In an embodiment, the portion 506 of the silicon substrate 502 can be above a textured surface 504 as shown. In some embodiments, an anti-reflective region 518 can be formed over the textured surface 504 of the solar cell 500.

Turning now to FIG. 11, a table is shown listing Temperature and Surface Dopant Concentration and output results, such as Gettering Location, Surface Passivation, Lifetime and Efficiency, for example processes of fabricating solar cells.

The method of FIGS. 1-4 is exemplified in Example Process C of FIG. 11, where a surface, or a portion near the surface, of a silicon substrate was doped at approximately less than or equal to $2 \times 10^{18}$ cm$^{-3}$ and the solar cell of Example Process C heated to a temperature above 900 degrees Celsius. The results from Example Process C are gettering in a polysilicon region of the silicon substrate, improved surface passivation at approximately 5 fA/cm$^2$, improved lifetime, e.g. typical of approximately 10 µsec, and a >0.5% efficiency increase as compared to other solar cells, e.g. referenced as the baseline efficiency.

In contrast, referring to Example Process A, a surface, or a portion near the surface, of the silicon substrate was doped at approximately less than or equal to $2 \times 10^{18}$ cm$^{-3}$ and the solar cell of Example Process A heated to a temperature below 900 degrees Celsius resulting in gettering in a non-polysilicon region of the solar cell, good surface passivation at approximately 2 fA/cm$^2$, poor lifetime, e.g. typical of approximately 3 µsec and no considerable, e.g., <0.5%, efficiency increase from the baseline.

In another example, referring to Example Process B, a surface of the silicon substrate was doped at approximately $4 \times 10^{18}$ cm$^{-3}$ and the solar cell of Example Process B heated to a temperature below 900 degrees Celsius resulting in gettering in a non-polysilicon region of the solar cell, poor surface passivation at approximately 5 fA/cm$^2$, good lifetime, e.g. typical of approximately 10 µsec and no considerable, e.g. <0.5%, efficiency increase from the baseline.

In yet another example comparison, in Example Process D a surface of the silicon substrate was doped at approximately $4\times10^{18}$ cm$^{-3}$ and the solar cell of Example Process D heated to a temperature above 900 degrees Celsius also resulted gettering in a polysilicon region of the silicon substrate, but poor surface passivation at approximately 5 fA/cm$^2$, good lifetime, e.g. typical of approximately 10 μsec and no considerable, e.g. <0.5%, efficiency increase from the baseline.

In all Examples Processes A, B and D either the lifetime or surface passivation only was improved, and the Example Process C resulted in improved surface passivation, lifetime and efficiency.

Figure 8:
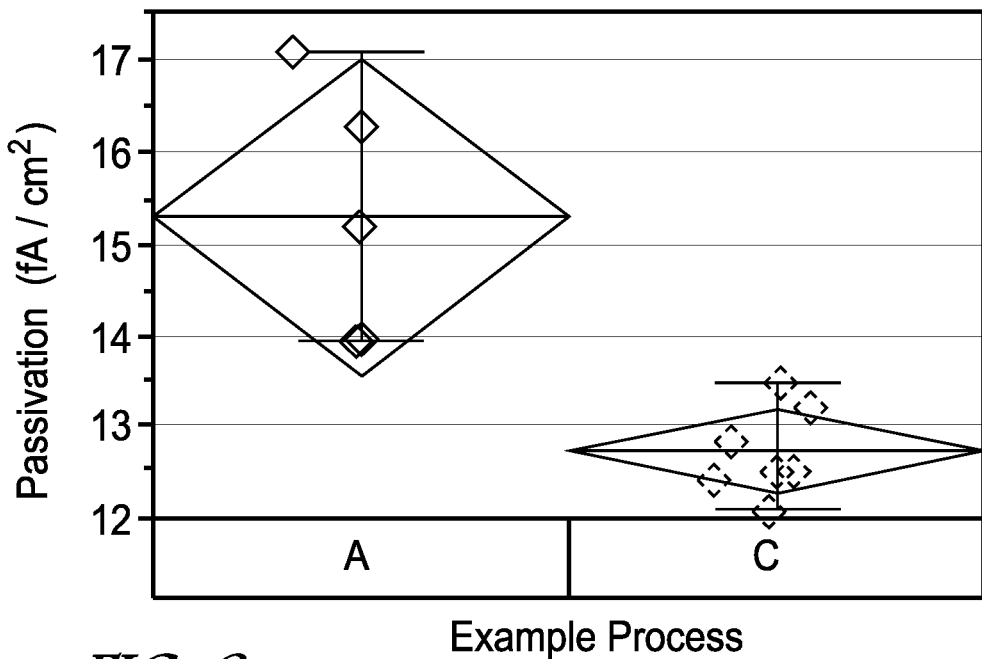
FIG. 8 illustrates a graph of example surface passivation measurements, according to some embodiments.
Figure 9:
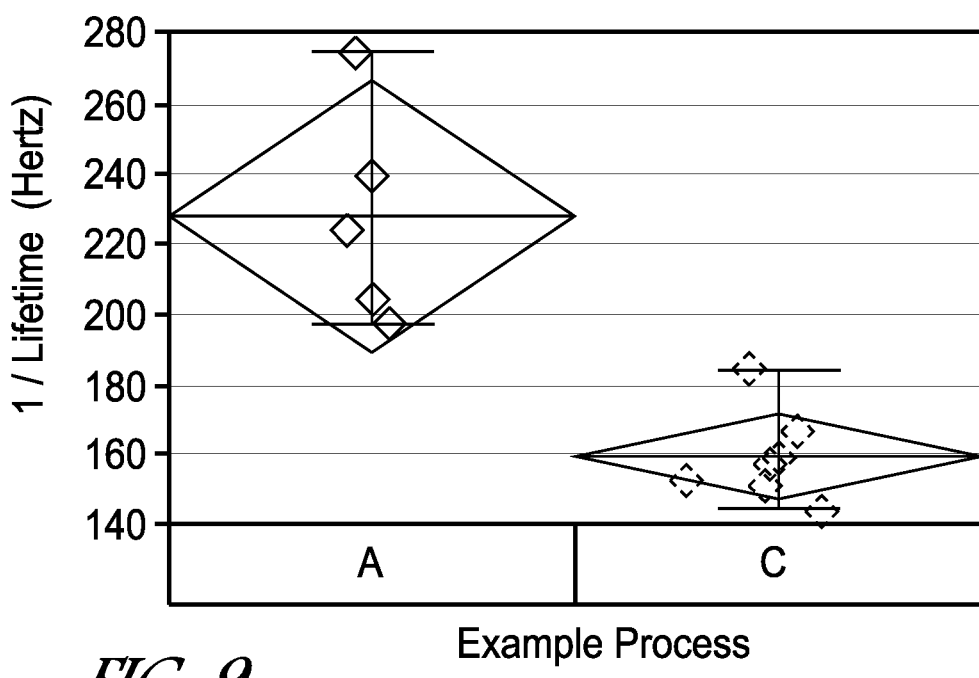
FIG. 9 illustrates a graph of example 1/lifetime measurements, according to some embodiments.
Figure 10:
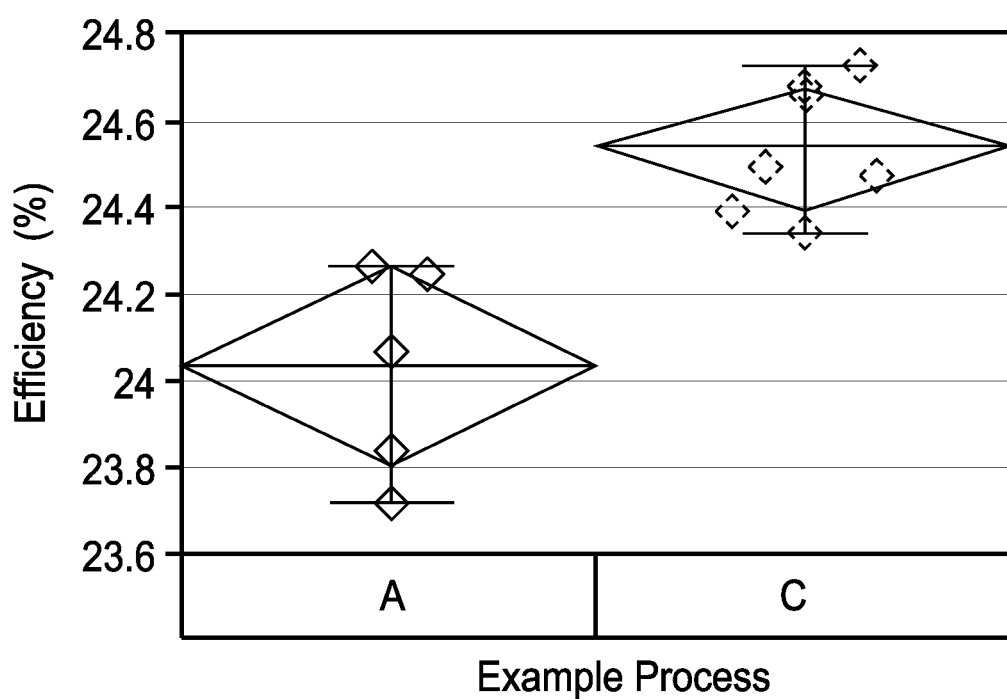
FIG. 10 illustrates a graph of example efficiency measurements, according to some embodiments.

With reference to FIGS. 8-10, example surface passivation, 1/lifetime and efficiency measurements, respectively, for solar cells fabricated using the methods of the Example Processes A and C of FIG. 11 is shown. The results from FIGS. 8-10 show that the surface passivation, lifetime and efficiency of solar cells fabricated using the method of FIGS. 1-4, e.g., Example Process C, have improved surface passivation, lifetime and higher efficiency measurements as compared to the solar cells of Example process A.

FIG. 8 illustrates a graph of surface passivation measurements from solar cells fabricated using the Example Process A and C from FIG. 11. As shown, the Example Process C has lower passivation results as compared to Example Process A. Lower surface passivation is preferred for high efficiency solar cells. Thus, the Example Process C has improved surface passivation results as compared to Example Process A.

With reference to FIG. 9, there is shown a graph of 1/lifetime measurements from solar cells fabricated using the Example Process A and C from FIG. 11. As shown, the Example Process C has higher lifetime, lower 1/lifetime results, as compared to Example Process A. Higher lifetime is preferred for high efficiency solar cells. Thus, the Example Process C has improved lifetime results as compared to Example Process A.

FIG. 10 illustrates a graph of efficiency measurements from solar cells fabricated using the Example Process A and C from FIG. 11. As shown, the Example Process C has higher efficiency results as compared to Example Process A. Higher solar cell efficiency conversion is preferred to maximize the electricity conversion from collected light. Thus, the Example Process C has improved efficiency results over Example Process A.

The results of FIGS. 8-10 demonstrate that a solar cell fabrication technique of FIGS. 1-4 results in overall improvement for surface passivation, lifetime and efficiency from other techniques, e.g. Example Processes A, B and D.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. A solar cell, the solar cell having a front side which faces the sun during normal operation and a back side opposite the front side, the solar cell comprising:
    a silicon substrate, wherein a portion of the silicon substrate has a dopant concentration of approximately less than or equal to $2\times10^{18}$ cm$^{-3}$ and wherein the portion of the silicon substrate is formed at the back side of the solar cell;
    a first dielectric region formed over the silicon substrate, wherein the first dielectric region is formed over the front side of solar;
    a first emitter region having metal impurities formed over the first dielectric region; and
    a first metal contact formed over the first emitter region.

2. The solar cell of claim 1, wherein the portion of the silicon substrate comprises N-type dopants.

3. The solar cell of claim 1, wherein the portion of the silicon substrate comprises phosphorus.

4. The solar cell of claim 1, wherein the portion of the silicon substrate comprises P-type dopants.

5. The solar cell of claim 1, wherein the portion of the silicon substrate comprises boron.

6. The solar cell of claim 1, wherein the first emitter region comprises polysilicon.

7. The solar cell of claim 1, further comprising:
    a second emitter region having metal impurities formed over the silicon substrate, wherein the second emitter region is formed over the back side of solar; and
    a second metal contact formed over the second emitter region.

8. The solar cell of claim 1, further comprising:
    a second dielectric region formed over the silicon substrate, wherein the second dielectric region is formed over the back side of solar;
    a second emitter region having metal impurities formed over the second dielectric region; and
    a second metal contact formed over the second emitter region.

9. The solar cell of claim 8, wherein the second emitter region comprises polysilicon.

10. A solar cell, the solar cell having a front side which faces the sun during normal operation and a back side opposite the front side, the solar cell comprising:
    a silicon substrate, wherein a portion of the silicon substrate has a dopant concentration of approximately less than or equal to $2\times10^{18}$ cm$^{-3}$ and wherein the portion of the silicon substrate is formed at the front side of the solar cell;
    a dielectric region formed over the silicon substrate, wherein the dielectric region is formed over the back side of solar;
    a first emitter region having metal impurities formed over the dielectric region; and
    a first metal contact formed over the first emitter region.

11. The solar cell of claim 10, wherein the portion of the silicon substrate comprises N-type dopants.

12. The solar cell of claim 10, wherein the portion of the silicon substrate comprises phosphorus.

13. The solar cell of claim 10, wherein the portion of the silicon substrate comprises P-type dopants.

14. The solar cell of claim 10, wherein the portion of the silicon substrate comprises boron.

15. The solar cell of claim 10, wherein the first emitter region comprises polysilicon.

16. The solar cell of claim 10, further comprising:
a second emitter region having metal impurities formed over the dielectric region; and
a second metal contact formed over the second emitter region.

17. The solar cell of claim 16, wherein the second emitter region is separate from the first emitter region.

18. The solar cell of claim 16, wherein a trench region separates the first emitter region from the second emitter region.

19. The solar cell of claim 16, wherein the second emitter region comprises polysilicon.

20. The solar cell of claim 16, wherein the first emitter region comprises a P-type doped polysilicon region and the second emitter region comprises a N-type doped polysilicon region.

* * * * *

UNITED STATES PATENT AND TRADEMARK OFFICE
CERTIFICATE OF CORRECTION

| | |
|---|---|
| PATENT NO. | : 11,251,315 B2 |
| APPLICATION NO. | : 16/877255 |
| DATED | : February 15, 2022 |
| INVENTOR(S) | : Smith et al. |

It is certified that error appears in the above-identified patent and that said Letters Patent is hereby corrected as shown below:

In the Claims

Column 10, Line 58, insert -- the -- after "of", insert -- cell -- after "solar" and before the ";".

Signed and Sealed this
Eighth Day of August, 2023

Katherine Kelly Vidal
*Director of the United States Patent and Trademark Office*